(12) United States Patent
Chuah et al.

(10) Patent No.: US 10,771,063 B2
(45) Date of Patent: Sep. 8, 2020

(54) CONFIGURABLE FIRST IN FIRST OUT AND DESERIALIZER CIRCUITRY

(71) Applicant: Intel Corporation, Santa Clara, CA (US)

(72) Inventors: Eah Loon Alan Chuah, Tanjung Tokong (MY); Hui Hui Ngu, Bayan Lepas (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/456,068

(22) Filed: Jun. 28, 2019

(65) Prior Publication Data

US 2019/0319628 A1 Oct. 17, 2019

(51) Int. Cl.
| | |
|---|---|
| *H03K 19/17736* | (2020.01) |
| *H03K 19/17732* | (2020.01) |
| *H03K 19/17728* | (2020.01) |
| *H03K 19/1776* | (2020.01) |

(52) U.S. Cl.
CPC ... *H03K 19/17744* (2013.01); *H03K 19/1774* (2013.01); *H03K 19/1776* (2013.01); *H03K 19/17728* (2013.01); *H03K 19/17732* (2013.01)

(58) Field of Classification Search
CPC ......... H03K 19/17744; H03K 19/1776; H03K 19/17728; H03K 19/17732; H03K 19/1774; H01L 21/76801
See application file for complete search history.

(56) References Cited

U.S. PATENT DOCUMENTS

| | | | |
|---|---|---|---|
| 6,724,328 B1* | 4/2004 | Lui | H03M 9/00 341/101 |
| 7,046,174 B1* | 5/2006 | Lui | H03K 5/135 341/100 |
| 7,157,937 B2 | 1/2007 | Apostol et al. | |
| 7,310,399 B1* | 12/2007 | Venkata | G06F 1/10 375/371 |
| 7,463,062 B2 | 12/2008 | Or-Bach et al. | |
| 8,294,159 B2* | 10/2012 | Or-Bach | H01L 21/76254 257/74 |
| 2003/0052709 A1* | 3/2003 | Venkata | H03K 19/17732 326/37 |

\* cited by examiner

*Primary Examiner* — Daniel D Chang
(74) *Attorney, Agent, or Firm* — Fletcher Yoder P.C.

(57) ABSTRACT

An integrated circuit device with a single via layer, in which the via layer includes selectable via sites and/or jumpers. The selectable via sites and/or placement of jumpers may be used to configure and interconnect components and circuitry between distinct layers of multilayer circuits. In some implementations, selectively enabling via sites, such as by filling via opening and/or using jumpers, may form a deserializer circuit with a first via configuration or a first-in first-out (FIFO) circuit with a second via configuration.

20 Claims, 15 Drawing Sheets

FIG. 9

CONFIGURABLE FIRST IN FIRST OUT AND DESERIALIZER CIRCUITRY

BACKGROUND

This disclosure relates to an integrated circuit device used to support different applications by configuring via connections of a via layer.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be developed using lithography techniques that pattern circuitry onto a substrate wafer that is diced to form a number of (generally identical) individual integrated circuit die. Each integrated circuit die for a particular application may include many different components, such as programmable logic fabric, digital or analog signal transmission circuitry, digital signal processing circuitry, application-specific data processing circuitry, memory, and so forth. The lithography techniques to form circuits on an integrated circuit die may involve using a variety of different steps, possibly including one or more photomasks (e.g., a photomask set) corresponding to that specific circuitry on the integrated circuit die. In other words, manufacturing an integrated circuit die that has a first functionality may involve a completely different process and/or photomask set as compared to an integrated circuit die that has a second functionality.

BRIEF DESCRIPTION OF THE DRAWINGS

Various aspects of this disclosure may be better understood upon reading the following detailed description and upon reference to the drawings in which:

FIG. 9 is a block diagram of waveforms for single data rate (SDR) sampling and FIFO application using the configured circuitry of FIG. 7A and FIG. 7B, in accordance with an embodiment of the present disclosure;

DETAILED DESCRIPTION OF SPECIFIC EMBODIMENTS

Figure 1:
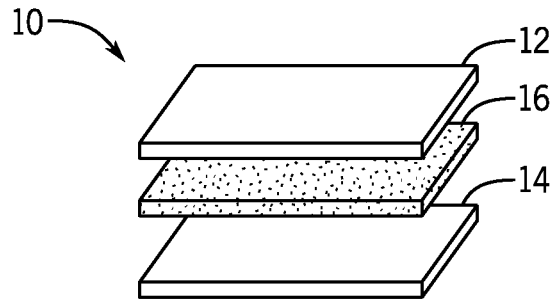
FIG. 1 is a block diagram of multiple layers of an integrated circuit device, in accordance with an embodiment of the present disclosure.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements.

The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

Circuitry of an integrated circuit device may be unique to the specific application for which the integrated circuit device is used. As such, the production of each integrated circuit device for a particular application may include additional and/or different fabrication steps, rendering a particular integrated circuit device designed for one application to be become inoperable or ineffective for to perform a different application function. These additional or different fabrication steps may relate to photomasks that are used to pattern circuitry for the specific application functions onto a substrate. Since the circuitry for one application function may be different than the circuitry of a different application function, the photomasks used for each of these circuitry patterns may not be used for both applications. As will be discussed in detail herein, producing the unique circuitry onto a substrate (e.g., wafer) during device fabrication includes the use of lithographic photomasks. Photomasks are silica plates with a pattern (e.g., circuit pattern) of opaque and transparent areas that are projected onto the substrate to define the layout of the integrated circuit. In some implementations, a set of photomasks may be used to define one or more pattern layers of a multilayered structure of the integrated circuit. In general, a photomask is placed over the substrate and short wavelength radiation (e.g., short wavelength light) is passed through to project the pattern onto the substrate surface. The patterns may guide the deposit or removal of material from the substrate.

In some implementations, integrated circuit devices include multiple layers, and often, these layers are fabricated in a sequential process. Accordingly, each of the multiple layers may be fabricated using a unique photomask or set of photomasks. As such, at least some of the photomask patterns used for a specific circuit design may be not be used for a different circuit design. Thus, producing multiple photomasks for the various integrated circuit devices and/or their multiple layers may have their own respective costs.

The integrated circuit device for a particular application may include one circuit to perform one function and another circuit to perform another function of the application. By way of example, an integrated circuit device, such as an application specific integrated circuit (ASIC), may include a first-in first-out (FIFO) circuit along with a deserializer circuit. The FIFO circuit and the deserializer circuit may each be associated with separate respective photomasks. However, these circuits may include common components.

It may be desirable to maintain a single integrated circuit architecture that is configurable to support each of these functions. Moreover, since a single circuit with common circuitry may be used to provide both the FIFO and deserializer functions, the overall costs of producing multiple photomasks for each circuit and/or multiple integrated circuit layers may be mitigated. To implement an integrated circuit device configurable for various applications, a via layer may be connected to components and circuitry between the layers of the integrated circuit. Thus, via opening may be selectively located and formed (e.g., filled or coated with metal) on the via layer to create interconnections between the various components to implement a FIFO or deserializer circuit in the integrated circuit device. While this disclosure will primarily use the example of an ASIC, the systems and methods of this disclosure may apply to any suitable integrated circuit devices. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), and microprocessors, just to name a few.

With the foregoing in mind, FIG. 1 illustrates an integrated circuit device 10 that includes multiple layers of circuitry. As shown, the integrated circuit device 10 may include a first circuit layer 12 and a second circuit layer 14. Circuit components for a particular application (e.g., either deserializer or FIFO) may be attached or embedded to either the first circuit layer 12 and/or the second circuit layer 14 and their electrical connections may be routed on their respective first circuit layer 12 and second circuit layer 14. However, the components used for these applications are often the same components. Thus, any redundant components may unnecessarily take space on the substrates of the integrated circuit device 10. Furthermore, producing the first circuit layer 12, the second circuit layer 14, and additional layers (not shown) may each use a unique photomask or sets of photomasks.

The circuit layers 12 and 14 may be designed to have a variety of possible connections at a variety of possible via sites. Vias are integrated circuit structures that allow circuitry on one layer to form a connection with circuitry on another layer. Depending on the via configuration of one or more via layers 16, the circuit layers 12 and 14 may have different functionalities. Thus, many different integrated circuit devices 10 may be manufactured using the same circuit layers 12 and 14, but the different integrated circuit devices 10 may be manufactured to have different functionalities by selecting a different via configuration for the one or more via layers 16. The one or more via layers 16 may be manufactured to have a variety of different possible via configurations, where each via configuration provides different connections that determine the functionality of the layers 12 and 14, even while the layers 12 and 14 may not be changed. Thus, by manufacturing the one or more via layers 16 using a particular selected photomask or photomask set that results in a particular via configuration, a functionality of the circuit layers 12 and 14 may be controlled. It should be appreciated that, while two circuit layers 12 and 14 and one or more via layers 16 have been shown by way of example, any suitable number of circuit layers and via layers may be used. Moreover, one or more via layers may also be disposed to connect to an outer surface for selectively connecting to circuitry in a 2.5D or 3D configuration (e.g., another integrated circuit device 10, an interposer, or Embedded Multi-Die Interconnect Bridge (EMIB) by Intel Corporation®).

Figure 2:
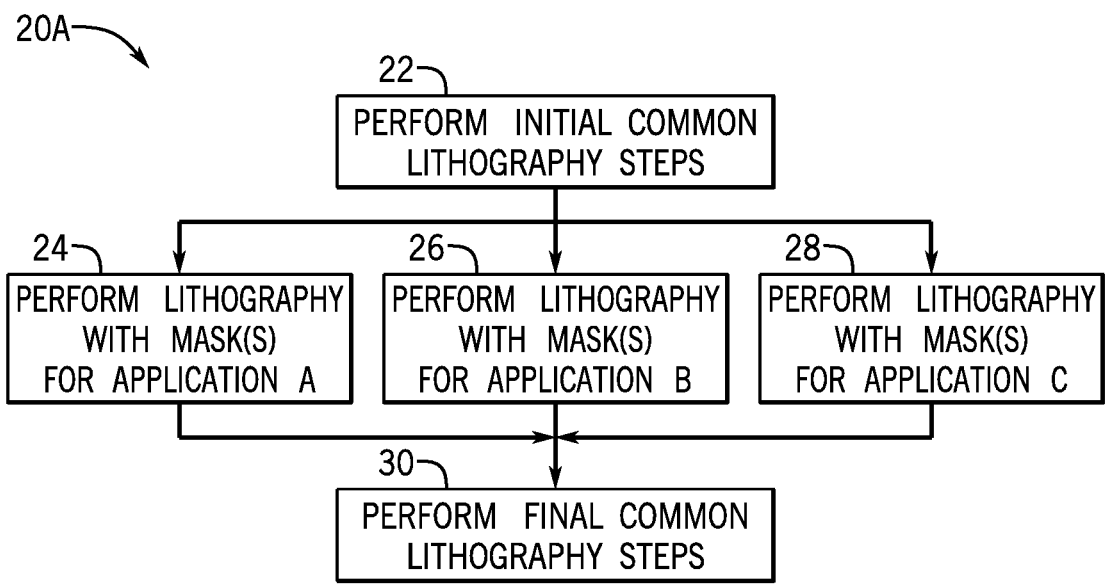
FIG. 2 is a process flow diagram of a lithography process to fabricate the integrated circuit device with a via layer for various applications, in accordance with an embodiment of the present disclosure.

To illustrate, FIG. 2 shows a process flow diagram of process 20A for fabricating an integrated circuit device 10 with a particular via layer that causes the integrated circuit device 10 to selectively provide functionality for one of many different applications depending on the via configuration of the via layer. In general, the overall process 20A for fabricating integrated circuit devices 10 for each particular application includes steps of depositing, patterning, removing, and modifying electrical properties. As shown, the process may begin with performing (block 22) initial common lithography steps. These steps may include the depositing process, which includes coating or transferring photoresist material (e.g., liquid polymeric material or dry film photoresists) onto a substrate, such as a wafer. The photoresist is material that the image may be transferred to during the patterning process.

Next, the patterning step may include fabricating patterns from a photomask onto the wafer by exposing the wafer to light using the photomask. As previously discussed, photomasks are often formed from silica plates with a pattern, such as a circuit pattern, of opaque and transparent areas that are projected onto the wafer to define the layout of the integrated circuit. In some implementations, a set of photomasks may be used to define one or more pattern layers of the multilayered structure of the integrated circuit device 10. In general, the photomask is placed over the substrate and a short wavelength light is passed through to project the pattern onto the substrate surface.

While the common lithography steps of block 22 are common to all versions of the integrated circuit device 10 that are manufactured using the process 20A, different versions of the integrated circuit device 10 may have different functionalities associated with different applications (e.g., shown here as Application A, Application B, and Application C) depending on the particular via configuration of a via layer of the integrated circuit device 10. Thus, the process 20A may also include performing (block 24) lithography with mask(s) for Application A (e.g., FIFO circuitry) that produces one or more via layers that will form connections that cause the circuitry formed at block 22 to operate with a first functionality (e.g., as a FIFO). On the other hand, the process 20A may include performing (block 26) lithography with mask(s) for Application B (e.g., a deserializer circuit) that produces one or more via layers that will form connections that cause the circuitry formed at block 22 to operate with a second functionality (e.g., as a deserializer). Further, the process 20A may include performing (block 28) lithography with mask(s) for a different application ("Application C") that produces one or more via layers that will form connections that cause the circuitry formed at block 22 operate with a third functionality associated with Application C. Specifically, performing lithography for each of these applications may include selecting via sites of the via layer to configure for either the integrated circuit device 10 for Application A, Application B, or Application C. Thus, the one or more via layer photomasks or photomask sets are used to pattern and selectively connect components for each of the different integrated circuits 10 (e.g., integrated circuits for each application A, B, and C) that may be manufactured by the process 20A.

The process 20A may include performing (block 30) certain final common lithography steps, which may include steps related to the removal of coating and modification of electrical properties.

The location of the multiple via sites or openings may be based on the various possible application functions to be performed and the components used to perform such functions. The selectable via sites may be filled (e.g., configured or selected) or remain unfilled (e.g., not selected) depending on the specific application to be performed. Thus, when the via layer is configured for Application A by selecting particular via sites that connect the components corresponding to perform Application A, there may be via sites that remain unselected since the components connected to those via sites may not be used to perform the functions of Application A. Similarly, some of the via sites used to perform Application A may not be selected when the via layer is configured for Application B. As such, using a lithography process for each particular application (e.g., Applications A, B, and C) may be mitigated or avoided by using the configurable via layer. Thus, fewer photomasks and/or application specific integrated circuit devices 10 may be manufactured, resulting in lower manufacturing costs and more efficient integrated circuit devices 10. Upon configuring the via layer for the particular application, such as by selecting particular vias (e.g., filing via openings with metal) to interconnect components used for the particular application, the integrated circuit, or at least those vias selected, may have a static configuration.

Figure 3A:
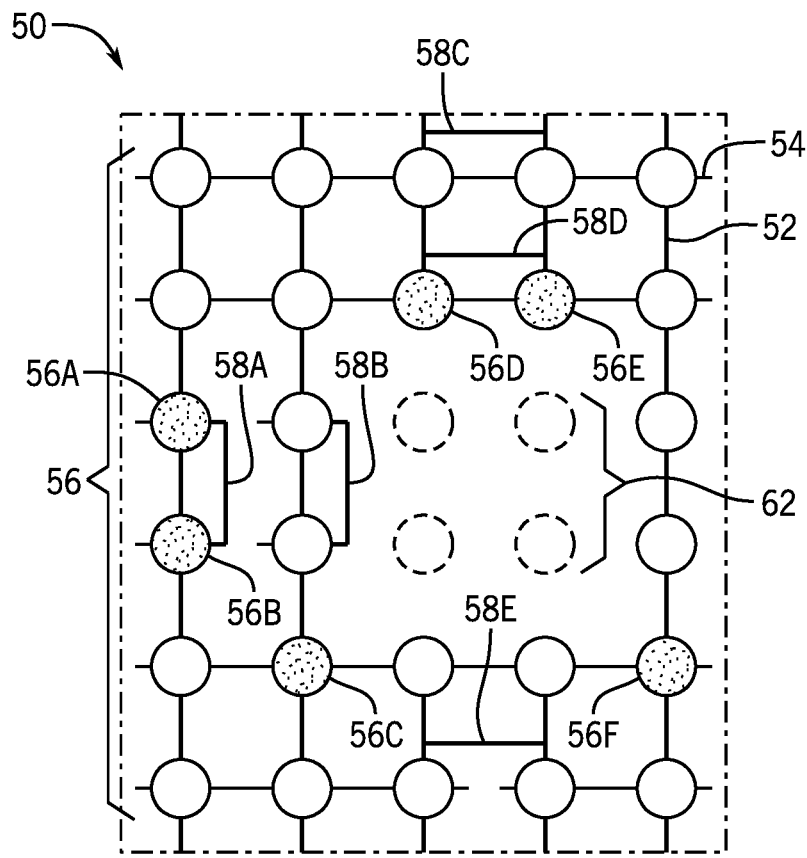
FIG. 3A is a block diagram of a via layer with via connections between multiple layers of the integrated circuit device, in accordance with an embodiment of the present disclosure.
Figure 3B:
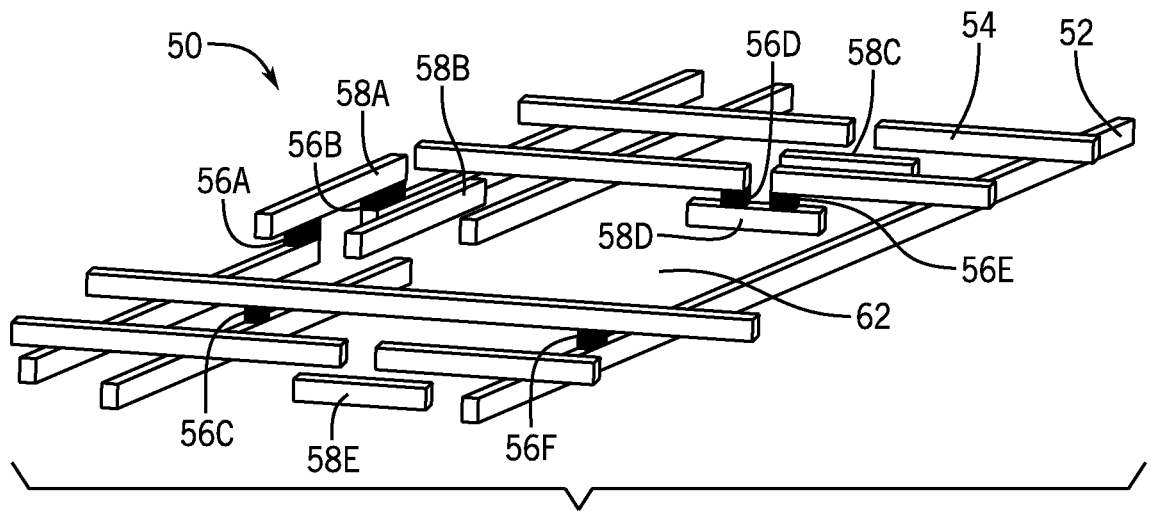
FIG. 3B is a three dimensional block diagram of the via layer of FIG. 3A, in accordance with an embodiment of the present disclosure.

To facilitate the reuse of circuitry or components between the layers of the single integrated circuit device 10 to implement different applications, vias may be used. For example, and referring back to Applications A and B, some of the circuitry components that are used for Application A may also be used for the circuitry for Application B. Thus, these circuitry components may be reused when the via layer is configured for either Application A or Application B. To illustrate, FIG. 3, which represents a particular embodiment, depicts an integrated circuit device 10 with a via layer 50 (e.g., via layer 16 of FIG. 1) including selectable via sites 56 that may connect components and/or circuitry residing on different layers of the integrated circuit device 10. Although the integrated circuit device 10 is discussed as having two layers (e.g., first circuit layer 12 and second circuit layer 14 of FIG. 1) in the current embodiment, it should be appreciated that three or more layers may be used to implement different applications or functions using the vias connections described herein. The additional via layers 50 may be used to connect components between the three or more layers.

As shown, the via layer 50 may include a vertical segment layer 52 (as indicated by the vertical bold lines) of metal segments and a horizontal segment layer 54 (as indicated by the horizontal and relatively thinner lines) of metal segments. The vertical segment layer 52 and the horizontal segment layer 54 may each include selectable via sites 56, which may be used to interconnect segments of the vertical and horizontal segment layers 52 and 54. In some implementations, jumpers 58 may be selectively placed vertically or horizontally along the segments of the vertical segment layer 52 and the horizontal segment layer 54 to facilitate vias connections that may otherwise be disconnected. For example, the jumpers 58 may facilitate in connecting or disconnecting via sites 56 to connect or disconnect segments. As such, the via layer 50 may be reconfigured using the jumpers 58. The circuitry components on the first circuit layer 12 and the second circuit layer 14 that are connected to a respective segment of the via layer 50 (e.g., vertical segment layer 52 and the horizontal segment layer 54) may be connected or disconnected using the via sites 56 to form a circuit for a particular application.

To illustrate, selected vias (e.g., via sites filled with metal to create interconnection) are indicated by darkened selectable via sites 56 in the depicted embodiments. As shown, jumpers 58A, B, C, D, and E create a link between selectable via sites 56 that are on the same segment layer. For example, selectable via sites 56A and 56B may reside on separate segments of the vertical segment layer 52. Accordingly, jumper 58A may connect these two segments, such that when the selectable via sites 56A and 56B are selected, components and/or circuitry on their respective segments may be connected. Similarly, jumpers 58B, 58C, 58D, and 58E may connect selectable via sites 56, such that the jumpers 58 allow a connection to be made between segments of the vertical segment layer 52 or the horizontal segment layer 54, and between the vertical segment layer 52 and the horizontal segment layer 54 when their respective selectable via sites 56 are selected.

Although jumpers 58 may be placed between segments of the vertical segment layer 52 and the horizontal segment layer 54, some of the selectable via sites 56 may not be selected, as indicated by the white selectable via sites 56. In such instances, segments of vertical segment layer 52 and the horizontal segment layer 54 may not be connected. For example, jumper 58E may connect two segments of the horizontal segment layer 54 when the selectable via sites 56 are selected. Since these selectable via sites 56 are not selected, the segments may not be connected and thus, the components or circuitry on those segments may not be interconnected. Moreover, in some implementations, non-selectable via sites 62 may exist on the vertical segment layer 52 and/or the horizontal segment layer 54. The non-selectable via sites 62 may include areas that may not be suitable for a selectable via site 56. These areas may not be adjacent or parallel to components on the other layers, may include jumper connections, or that may include base circuitry or application specific circuitry that is not compatible for use for a different application.

To further illustrate the connections between the layers 52 and 54 using jumpers 58 and/or selectable via sites 56, FIG. 3 depicts a three dimensional (3-D) diagram of the via layer 50 of FIG. 2. As shown, segments of the vertical segment layer 52 and the horizontal segment layer 54 may be connected using jumpers 58 and selectable via sites 56 connections that correspond to FIG. 2. For example, selectable via sites 56A and 56B may reside on separate segments of the first layer 52. Accordingly, jumper 58A may connect these two segments, such that when the selectable via sites 56A and 56B are selected, components and/or circuitry on their respective layer segments may be connected. Also corresponding to FIG. 2, jumpers 58B, 58C, 58D, and 58E may connect selectable via sites 56, such that jumpers 58 allow a connection to be made between segments of the vertical segment layer 52 and the horizontal segment layer 54, and between the vertical segment layer 52 and horizontal segment layer 54 when their respective selectable via sites 56 are selected. These segments of layers 52 and 54 may include components or circuitry that may be connected to perform specific functions.

Specifically, the selectable via sites 56 that are selected may be active sites used to short the path between the vertical segment layer 52 and the horizontal segment layer 54. In this manner, the components on the portion of the layer connected to the via site 56 may be used or unused depending on the selection of the selectable via site 56. Thus, using vias may reduce the number of application specific circuits and layers, and correspondingly, reduce the number of photomasks used to produce each of the layers. Moreover, since circuit components between layers of the integrated circuit device 10 may be reused, vias may reduce the amount of circuitry and silicon area that may otherwise be used for each application.

As previously discussed, the integrated circuit device 10 may include a first-in first-out (FIFO) circuit along with a deserializer circuit. The FIFO circuit and the deserializer circuit may each be formed using separate photomasks. However, both these circuits may include common components. As will be described herein, rather than forming separate circuits, a single via layer 50 may be used to connect the redundant components of circuitry between layers of the integrated circuit device 10 to configure circuitry and implement the FIFO or deserializer function in the integrated circuit device 10. As used herein, redundant components may refer to one or more common components to the circuit resulting from the FIFO configuration and the circuit resulting from the deserializer configuration. Additionally or alternatively to selectable via sites 56, multiplexers may be used to dynamically configure and select specific circuitry to implement either the FIFO or deserializer.

Figure 4:
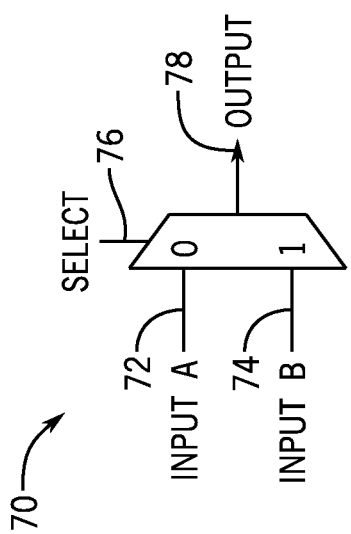
FIG. 4 is a schematic diagram of a multiplexer used to dynamically configure circuitry of the integrated circuit device, in accordance with an embodiment of the present disclosure.

To illustrate, FIG. 4 depicts a multiplexer 70 that may be dynamically configured and programmed to implement the FIFO or deserializer. As shown, the multiplexer 70 may include two input ports, input A 72 and input B 74, one control select signal, select 76, and an output port, output 78. A control select signal at select 76 may be used to control which input port (e.g., input A 72 or input B 74) is utilized to implement either the FIFO or deserializer. For example, input A 72 may be used for the output 78 when the control signal at select 76 has a value of "0." On the other hand, input B 74 may be used for the output 78 when the control signal at select 76 has a value of "1." Thus, to implement the FIFO or deserializer, circuits or components for input A 72 or input B 74 may be selectively enabled using select 76.

Figure 5:
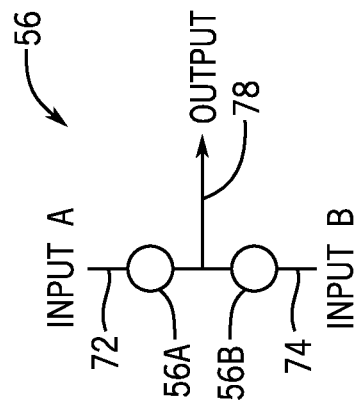
FIG. 5 is a schematic diagram of a vias connection of the via layer used to configure the integrated circuit device, in accordance with an embodiment of the present disclosure.

In other embodiments, vias may be used in conjunction with or in place of multiplexer 70 of FIG. 4. To illustrate, FIG. 5 depicts a static configuration of via sites 56 (e.g., selectable via sites 56 of FIG. 3) that may be selected (e.g., via openings filled with metal to create interconnection) to implement a particular application. As shown, the via site 56A may connect an input A 72 to output an output 78 when selected, or via site 56B may connect an input B 74 to output a different result of output 78 when selected. Circuitry and components of input A 72 connected to via site 56A may be enabled for use upon selection of the via site 56A. Similarly, circuitry or components of input B 74 that are connected to via site 56B, may be enabled for use upon selection or activation of the via site 56B.

Thus, by selecting or activating particular via sites 56A or 56B, the circuitry of the selected inputs (e.g., input A 72 or input B 74) may be included in the integrated circuit device 10 to be used for a particular application. Via sites 56 may be selected or unselected (e.g., remain unfilled) based on the application to be executed and the circuitry used for the particular application. As previously mentioned, via sites 56 of the via layer 50 may be selected to configure the integrated circuit device 10 by connecting redundant circuitry between the various layers of the integrated circuit device 10. In this manner, producing additional mask layers associated with each application specific integrated circuit device 10 and/or circuitry for a particular application of the integrated circuit device 10 may be mitigated.

Figure 6A:
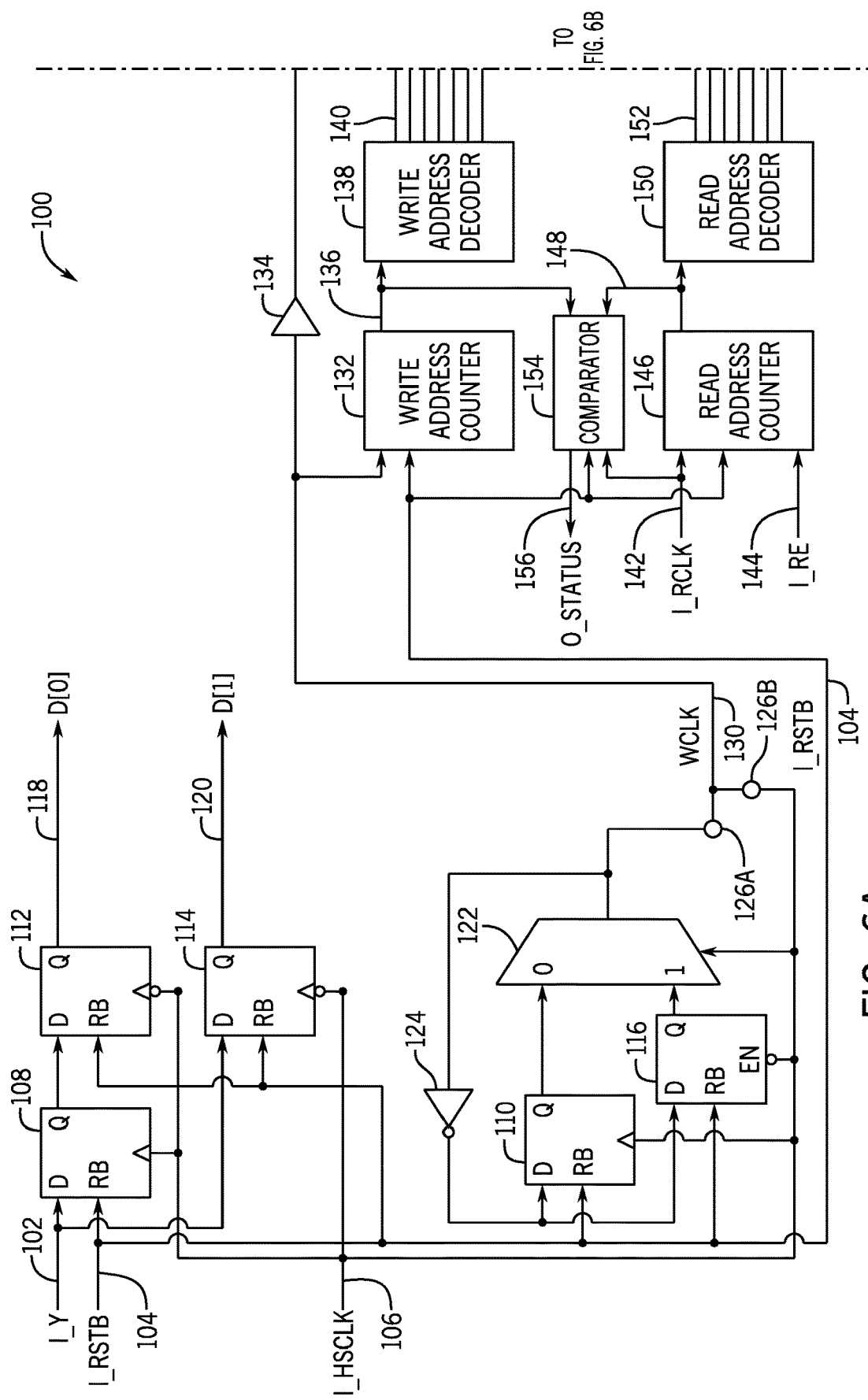
FIG. 6A is a schematic diagram of a data interface block of a configurable first-in first-out (FIFO) and deserializer circuitry, in accordance with an embodiment of the present disclosure.
Figure 6B:
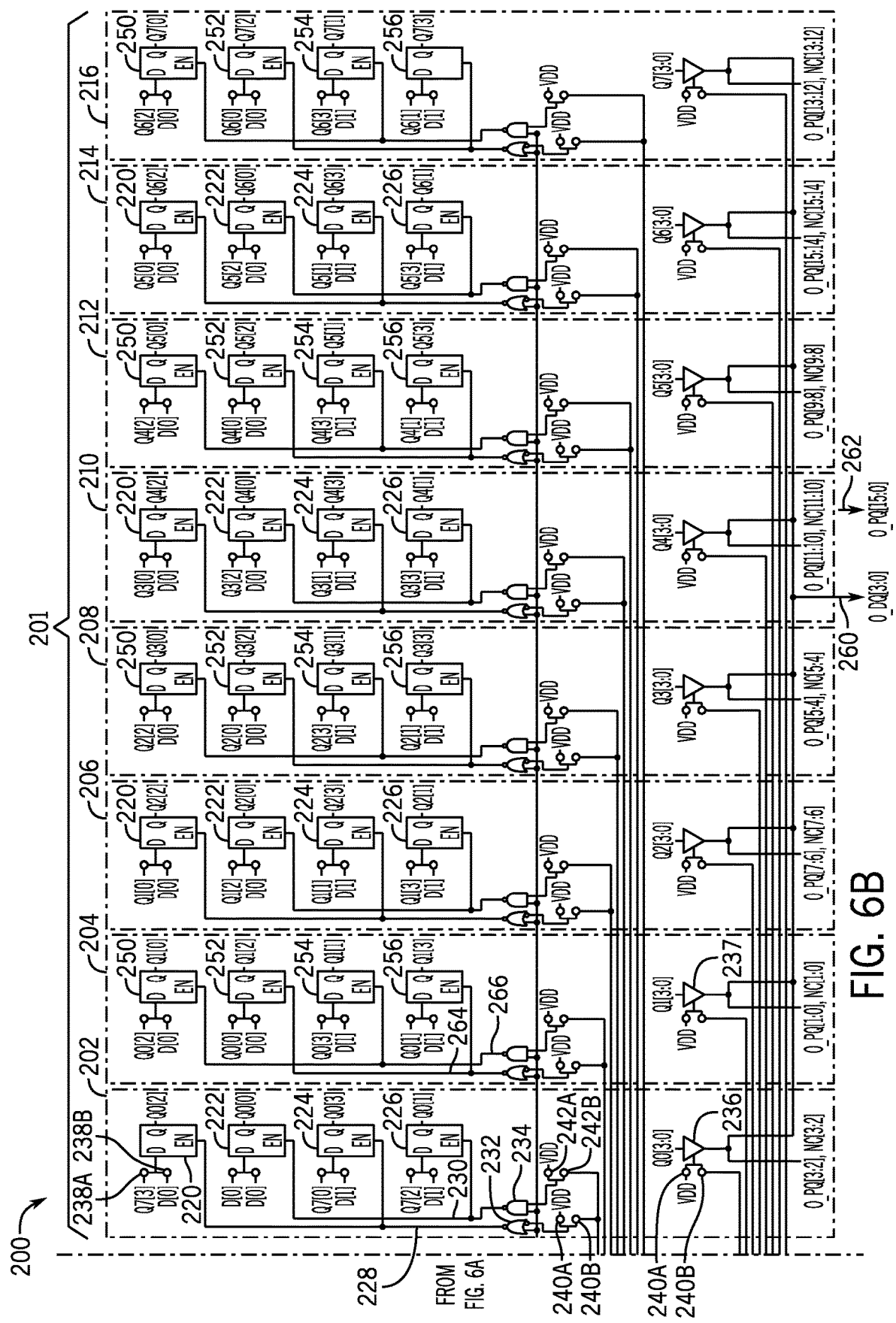
FIG. 6B is a schematic diagram of data logic blocks of the configurable FIFO and deserializer circuitry, in accordance with an embodiment of the present disclosure.

To illustrate, FIGS. 6A-B each show a portion of configurable circuitry that may be configured using via sites 56 of the via layer 50, to facilitate the same circuitry to function for different applications (e.g., deserializer or FIFO) by selecting specific via sites 56. Specifically, the circuitry may include a series of components, such as flip-flops, multiplexers, inverters, comparators, and read/write decoders and counters. The components, such as flip-flops, may selected and activated by a clock signal. FIG. 6A depicts a data interface block 100. The data interface block 100 may be configured for a double data rate (DDR) or a single data rate (SDR) sampling. In an SDR sampling, data is latched on either the rising edge or falling edge of a sample clock. In a DDR sampling, the data is latched on both the rising edge and the falling edge of the sample clock. In the depicted embodiment, input data (I_Y) 102, active low reset signal (I_RSTB) 104, and an input high speed clock (I_HSCLK) 106, are used to activate the flip-flops. In the depicted example, flip-flops 108 and 110 are active low flip-flops while flip-flops 112, 114, and 116 are active high-flops. Data may pass through a flip-flop when the clock signal of input high speed clock (I_HSCLK) 106 is applied and then may hold the value once the input high speed clock (I_HSCLK) 106 signals shifts, functioning as a memory device. Since flip-flops 108 and 110 are active high-flip flops, they are active when the input high speed clock (I_HSCLK) 106 is high, such that data may pass through when the clock signal is 1. On the other hand, since flip-flops 112 and 114 are active low-flip flops, data may pass when the input high speed clock (I_HSCLK) 106 is signal is low or 0. The sampled data is passed to FIFO or deserializer circuitry using data bus lines, D[0] 118 and D[1] 120, as will be discussed in detail in FIG. 6B.

Moreover, flip-flops 110 and 112, multiplexer 122, and inverter 124, may be used to generate a divide-by-2 clock with half the frequency of the input high speed clock (I_HSCLK) 106. To configure write clock (WCLK) 130 to the same frequency as the input high speed clock (I_HSCLK) 106 or half the frequency of the input high speed clock (I_HSCLK) 106, selectable via sites 126A and 126B (e.g., which may operate like the via sites 56 of FIG. 5) may be used. In particular, selecting via site 126B selects input high speed clock (I_HSCLK) 106, which allows configuring the write clock (WCLK) 130 to the same frequency. However, selecting via site 126A selects circuitry components used to provide half the frequency of the input high speed clock (I_HSCLK) 106.

The write clock (WCLK) 130 may be used by a write address counter 132, which generates address count in the form of binary code or gray code. Additionally, buffer 134 may be used to buffer and delay the write clock (WCLK) 130 for FIFO and deserializer circuitry, as will be described in FIG. 6B. In the current embodiment, the write address counter 132 generates a 3-bit write address (WADR[2:0]) 136, which may be further decoded by a write address decoder block 138 to generate an 8-bit one-hot write word line (WWL) 140. However, only one bit of the write word line (WWL) 140 is activated at a time. The write word line (WWL) 140 may then be used by FIFO circuitry, as will be described in detail in FIG. 6B.

Similarly, input read clock (I_RCLK) 142 and input enable (I_RE) 144 may be used by a read address counter 146 to generate a read address (RADR[2:0]) 148. A read address decoder block 150 may decode the read address (RADR[2:0]) 148 to generate a 8-bit one-hot read word line (RWL[7:0]) 152. However, only one bit of the read word line (RWL) 152 may be activated at a time. The read word line (RWL) 152 may be used by FIFO circuitry, as will be described in detail in FIG. 6B. Furthermore, the write address (WADR[2:0]) 136 and read address (RADR[2:0]) 148 may feed into a comparator 154 to generate a FIFO status flag (O_STATUS) 156. For example, the FIFO status flags 156 may indicate empty, full, almost empty, and almost full.

To illustrate the use of via sites 56 to configure circuitry of the integrated circuit device 10, FIG. 6B depicts data logic blocks of a portion of circuitry 200 that may be configured to a FIFO circuit or a deserializer circuit. The circuitry 200 includes multiple data storage blocks 201, such as storage blocks 202, 204, 206, 208, 210, 212, 214, and 216. Data storage blocks 204, 208, 212, and 216 are similar to each other except for their input and output connections. Similarly, storage blocks 202, 206, 210, and 214 are similar to each other except for their input and output connections. Each of the data storage blocks 201 may include two active high latches 220 and 224, two active low latches 222 and 226, a NOR gate 232 with an inverted input, a NAND gate 234, and a tri-state buffer 236. Input to the latches may be configured using via sites 56, for example, by selectable via sites 238A and 238B. The inverted input to the NOR gate 232 may be configured by using selectable via sites 240A and 240B and the input to the NAND gate 234 may be configured by using selectable via sites 242A and 242B. Moreover, a select signal of the tri-state buffer 236 may be configured by using selectable via sites 244A and 244B. The storage blocks 202, 206, 210, and 214 are similar to storage blocks 204, 208, 212, and 216 except for the sequence of the active high and active low latches. For example, latches 250 and 254 of storage block 204 are active low latches while 252 and 256 are active high latches.

Thus, depending on the different circuitry components selected using the via sites 56, the output may result in FIFO circuitry or deserializer circuitry. For example, the output may result in a FIFO output (O_DQ[3:0]) 260 for FIFO circuitry or a deserializer output (O_PQ[15:0]) 262 for deserializer circuitry.

Figure 7A:
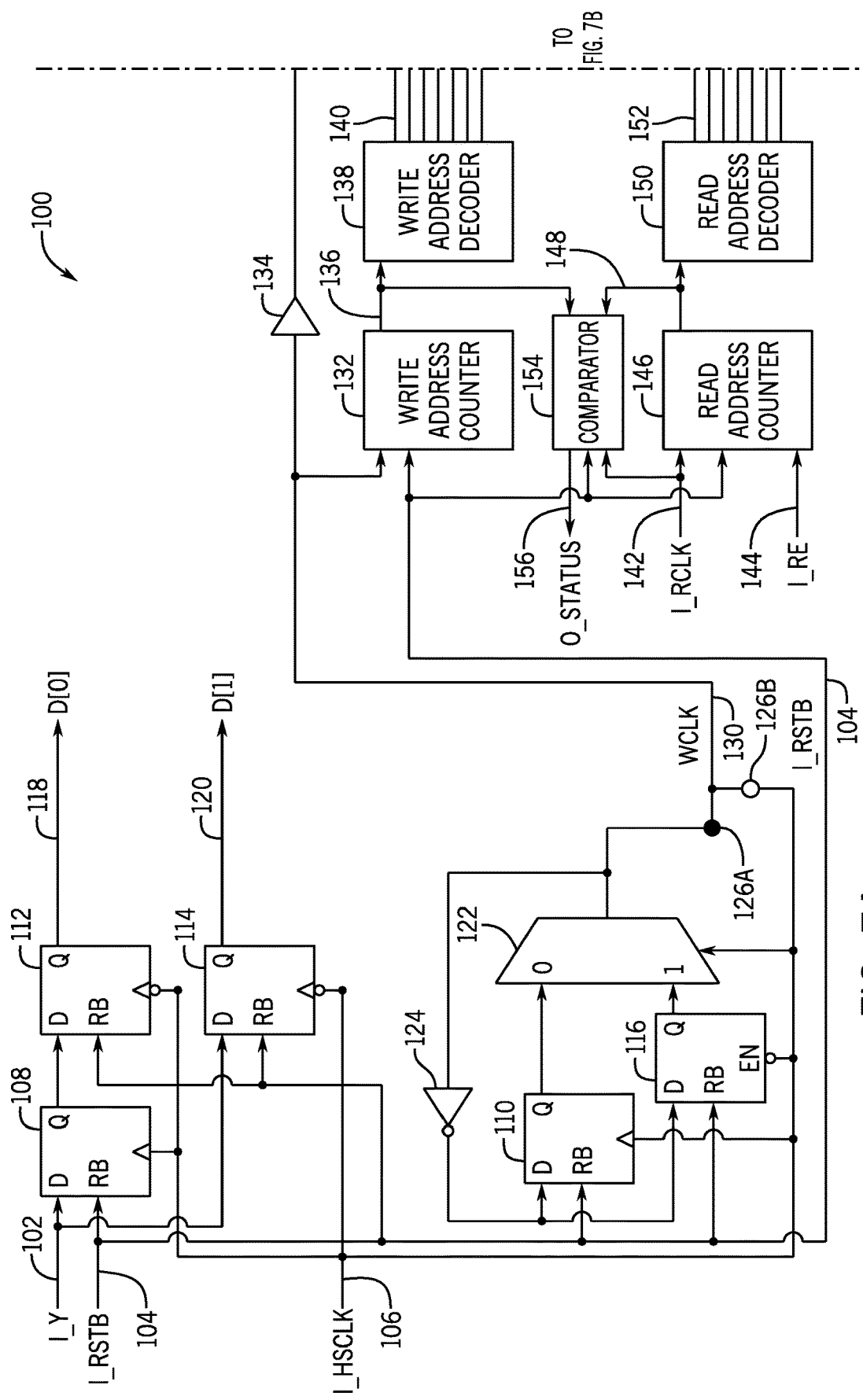
FIG. 7A is a schematic diagram of the data interface block of FIG. 6A configured for a FIFO circuit, in accordance with an embodiment of the present disclosure.
Figure 7B:
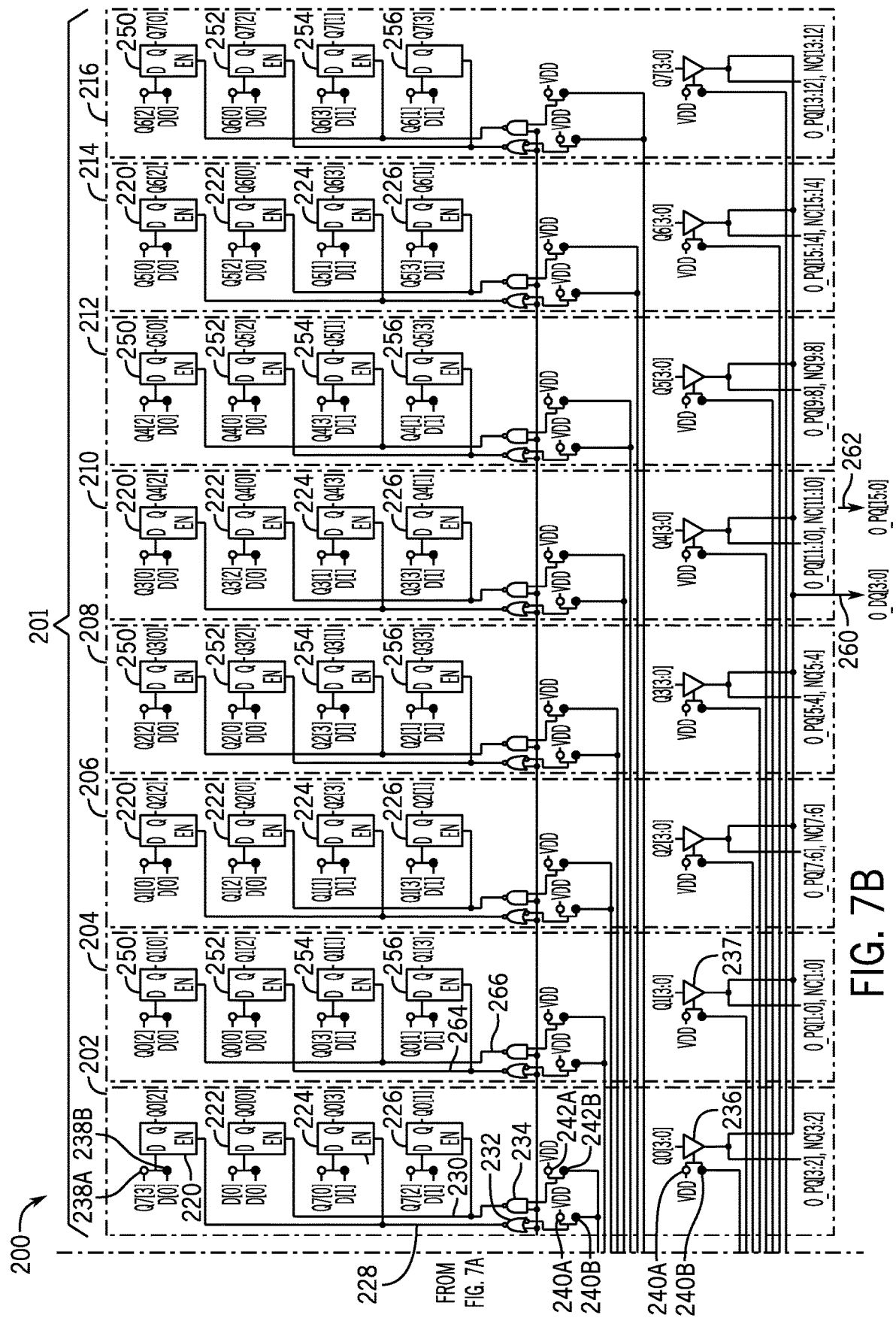
FIG. 7B is a schematic diagram of the data logic blocks of FIG. 6B configured for the FIFO circuit, in accordance with an embodiment of the present disclosure.

To illustrate, FIG. 7A and FIG. 7B depict a static configuration of a FIFO circuit using via sites 56 to selectively connect circuit components of the data interface block 100 of FIG. 6A and circuitry 200 of FIG. 6B. As shown, particular via sites 56 are selected to connect or disconnect components (e.g., input to the latches, inverted input to the NOR gate 232, input to NAND gate 234, and selection of the tri-state buffer 236) between the two layers (e.g., vertical segment layer 52 and the horizontal segment layer 54 of FIGS. 3A and 3B) of the integrated circuit device 10 to generate a complete circuitry for a particular application. As depicted, specific via sites 56 may be selected, as indicated by the dark shading, to interconnect the components between the two layers 52, 54.

In the depicted configuration of the data interface block 100 and circuitry 200 to implement the FIFO circuit, the write clock (WCLK) 130 is half the frequency of the input high speed clock (I_HSCLK) 106 as a result of the selected via sites 56. As shown in the current embodiment of the FIFO circuit, the input of the latches 220, 222, 250, and 252 is from the data bus line D[0] 118 while the input of the latches 224, 226, 254, and 256 is from the data bus line D[1] 120. The programmable input of the NAND gate 234 and the NOR gate 232 are connected to one bit of the write word line (WWL[7:0]) 140. Similarly, the programmable enable of the tri-state buffer 236 and 237 are connected to one bit of the read word line (RWL[7:0]) 152. Data storage blocks 202, 204, 206, 208, 210, 212, 214, 216 may each be connected to a different bit of the write word line (WWL[7:0]) 140 and the read word line (RWL[7:0]) 152.

Figure 8:
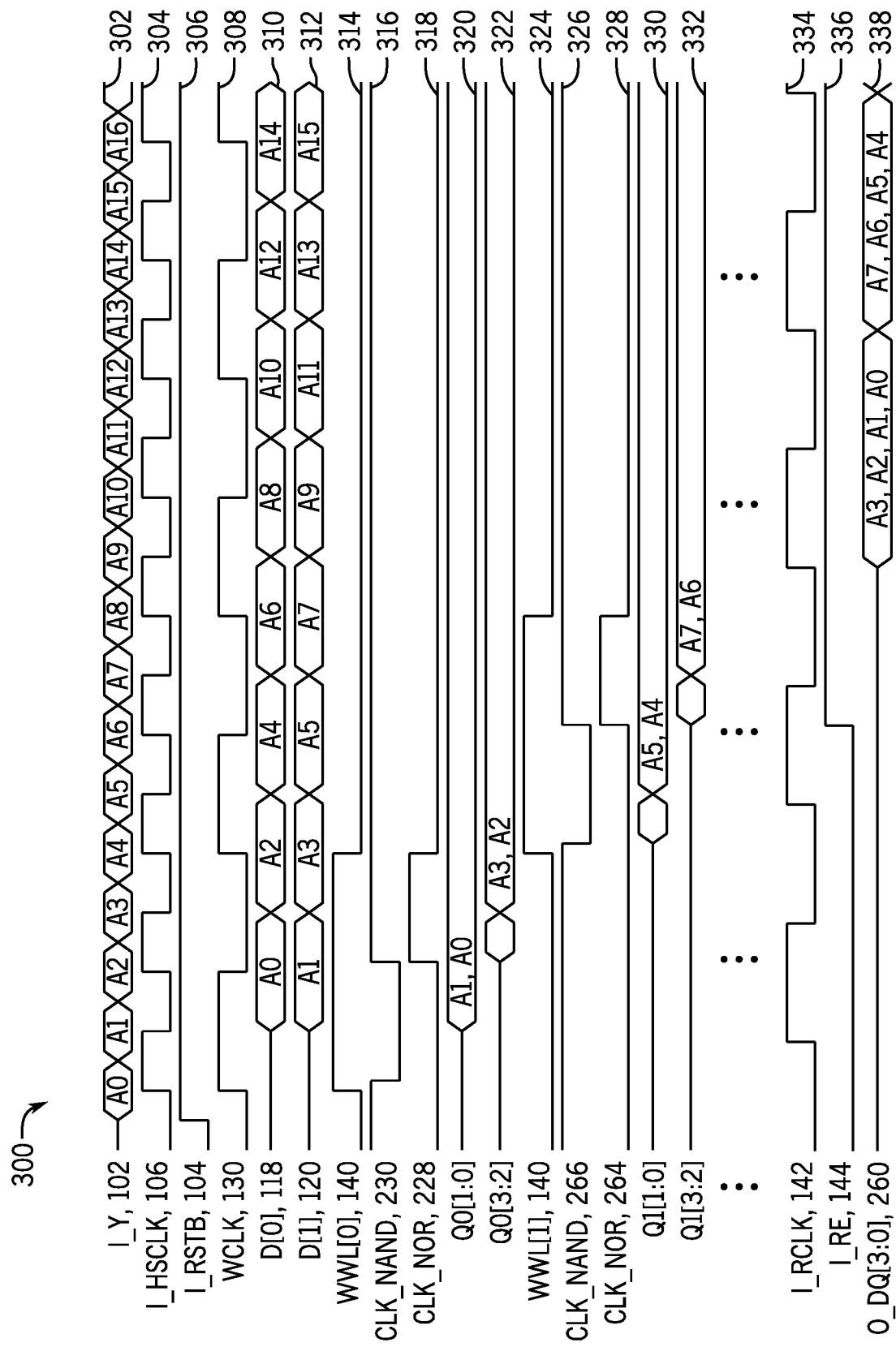
FIG. 8 is a block diagram of waveforms for double data rate (DDR) sampling and FIFO application using the configured circuitry of FIG. 7A and FIG. 7B, in accordance with an embodiment of the present disclosure.

FIG. 8 illustrates waveforms 300 demonstrating the relationships between signals for DDR sampling and FIFO application for the configured circuitry of FIG. 7A and FIG. 7B. As shown in waveform 308, input data (I_Y) 102 may be sampled at both the rising and falling edge of input high speed clock (I_HSCLK) 106, and write clock (WCLK) 130 may be half the frequency of the input high speed clock (I_HSCLK) 106. Waveform 310 shows the data sequence of the data bus line D[0] 118 and waveform 312 shows the data sequence for the data bus line D[1] 120.

Once write clock (WCLK) 130 begins toggling, the first bit of the write word line (WWL[0]) 140 may be activated, as shown by waveform 314. When write clock (WCLK) 130 is in the high phase and write word line (WWL[0]) 140 is activated, the clock NAND (CLK_NAND) 230 may be pulled low. As a result, clock NAND (CLK_NAND) 230 may have delay from write clock (WCLK) 130 due to the buffer 134, as shown by waveform 316. Additionally, when clock NAND (CLK_NAND) 230 is pulled low, it may enable the active low latches 222 and 226. Upon activation, data A0 and A1 will be latched into the latches 222 and 226 and propagated to Q0[0] and Q0[1], respectively, as shown in waveform 320.

On the other hand, when the write clock (WCLK) 130 is in the low phase and the word line (WWL[0]) 140 is activated, the clock NOR (CLK_NOR) 228 may be pulled high. However, clock NOR (CLK_NOR) 228 may have some delay from write clock (WCLK) 130 due to buffer 134, as shown by waveform 318. When clock NOR (CLK_NOR) 228 is pulled high, it may enable the active high latches 220 and 224. Data A2 and A3 will be latched into the active high latches 220 and 224 and propagated to Q0[2] and Q0[3] respectively, as shown by waveform 322.

At the second cycle of the write clock (WCLK) 130, the second bit of write word line (WWL) 140 may be activated. In the depicted embodiment, write word line (WWL[1]) 140 is activated as shown in waveform 324. When the write clock (WCLK) 130 is in the high phase and the write word line (WWL[1]) 140 is activated, the clock NAND (CLK_NAND) 230 will be pulled low and this will enable the active low latches 250 and 254. As a result, data A4 and A5 may be latched into the active low latches 250 and 254 and propagated to Q1[0] and Q1[1] respectively, as shown by waveform 330. When the write clock (WCLK) 130 is in the low phase and the write word line (WWL[1]) 140 is activated, the clock NOR (CLK_NOR) 228 may be pulled high, enabling the active high latches 252 and 256. As a result, data A6 and A7 will be latched into the active high latches 252 and 256 and propagated to Q1[2] and Q1[3] respectively, as shown by waveform 332.

At the third cycle of write clock (WCLK) 130, the third bit of write word line (WWL) 140 may be activated, resulting in activating data storage block 206. Writing into the corresponding latches for data storage block 206 may be performed using the techniques described above. The process of writing into respective latches is repeated for each available data storage blocks (e.g., 208, 210, 212, 214, and 216). Although the depicted embodiment shows 8 data storage blocks (8-bit data depth) with 4-bit data width, capable of storing up to 32-bit data, it should be noted that the methods and systems described herein may also be performed and implemented using other data storage blocks, such data storage blocks that are not limited to 8-bit data depth and 4-bit data width.

In some embodiments, the read clock (I_RCLK) 142 may be asynchronous to the input high speed clock (I_HSCLK) 106. Upon activation of the read enable (I_RE) 144, the first bit of read word line (RWL) 152 may be activated. Here, the read word line (RWL[0]) 152 is activated, and as a result, the tri-state buffer 236 may be enabled. This may allow the Q0[3:0] to propagate to the FIFO output (O_DQ[3:0]) 260, as shown by waveform 338. In the following cycle, another bit of the read word line (RWL) 152 may be activated. Upon activation, the read word line 152 (RWL[1]) may be activated. Upon activation of the read word line 152 (RWL[1]) being activated, the tri-state buffer 137 may be enabled, allowing the Q1[3:0] to propagate to FIFO output (O_DQ [3:0]) 260 as shown in waveform 338. Moreover, the process of reading may continue as long as the read enable (I_RE) 144 is enabled.

Figure 9:
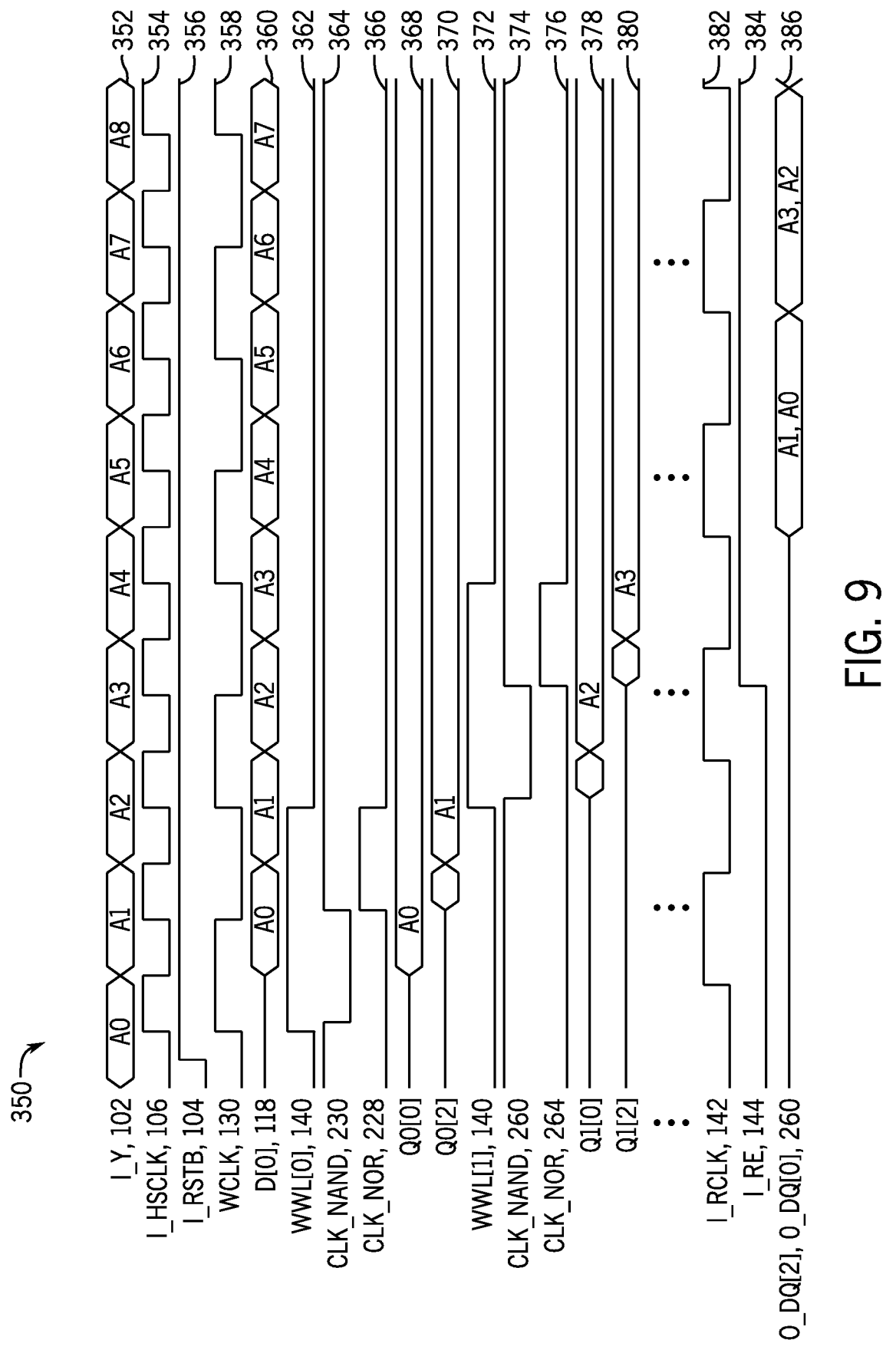

FIG. 9 illustrates waveforms 350 demonstrating the relationships between signals for SDR sampling and FIFO application for the configured circuitry of FIG. 7A and FIG. 7B. As shown, input data (I_Y) 102 is sampled at rising edge of input high speed clock (I_HSCLK) 106 and the write clock (WCLK) 130 may be half the frequency of input high speed clock (I_HSCLK) 106, as shown by waveform 358. In the current embodiment, waveform 360 shows the data sequence of data bus line D[0] 118. Once the write clock (WCLK) 130 begins to toggle, the first bit of the write word line (WWL) 140 may be activated. Here, write word line (WWL[0]) 140 is activated, as shown by waveform 362. As shown, the clock NAND (CLK_NAND) 230 may have some delay from the write clock (WCLK) 130 due to buffer 134, as shown by waveform 364. When clock NAND (CLK_NAND) 230 is pulled low, the active low latch 222 may be enabled. As a result, data A0 may be latched into latch 222 and propagated to Q0[0], as shown by waveform 368. However, when the write clock (WCLK) 130 is in the low phase and write word line (WWL[0]) 140 is activated, the clock NOR (CLK_NOR) 228 may be pulled high. However, clock NOR (CLK_NOR) 228 may have some delay from write clock (WCLK) 130 due to buffer 134, as shown by waveform 366. When clock NOR (CLK_NOR) 228 is pulled high, it may enable the active high latch 220. As a result, data A1 may be latched into the latch 220 and propagated to Q0[2], as shown by waveform 370.

At the second cycle of write clock (WCLK) 130, the second bit of the write word line (WWL) 140 may be activated. In the current implementation, write word line (WWL[1]) 140 is activated, as shown by waveform 372. When write clock (WCLK) 130 is in the high phase and the write word line (WWL[1]) 140 is activated, the clock NAND (CLK_NAND) 230 will be pulled low, enabling the active low latch 250. As a result, data A2 will be latched into the latch 250 and propagated to Q1[0], as shown by waveform 378. When the write clock (WCLK) 130 is in the low phase and write word line (WWL[1]) 140 is activated, the clock NOR (CLK_NOR) 264 may be pulled high, enabling the active high latch 252. As a result, data A3 may be latched into the latch 252 and propagated to Q1 [2] as shown by waveform 380.

At the third cycle of write clock (WCLK) 130, the third bit of write word line (WWL) 140 may be activated and thus data storage block 206 may be activated. Writing into the corresponding latches for data storage block 206 may be performed using the techniques described above. The process of writing into respective latches is repeated for each data storage blocks (e.g., 208, 210, 212, 214, and 216). Although the depicted embodiment shows 8 data storage blocks (8-bit data depth) with 2-bit data width, capable of storing up to 16-bit data, it should be noted that the methods and systems described herein may also be performed and implemented using other data storage blocks, such as data storage blocks that are not limited to 8-bit data depth and 2-bit data width.

The read clock (I_RCLK) 142 may be asynchronous to the input high speed clock (I_HSCLK) 106. Upon activation of the read enable (I_RE) 144, the first bit of read word line (RWL) 152 may be activated. Here, read word line (RWL [0]) 152 is activated, and as a result, the tri-state buffer 236 may be enabled. This may allow the Q0[2] and Q0[0] to propagate to the FIFO output (O_DQ[2]) 260 and FIFO output (O_DQ[0]) 260, as shown by waveform 386. In the following cycle, another bit of the read word line (RWL) 152 may be activated. Upon activation, the read word line (RWL[1]) 152 may be activated. The tri-state buffer 237 may be enabled upon the activation of the read word line (RWL[1]) 152 being activated, allowing the Q1[2] and Q1[0] to propagate to FIFO output (O_DQ[2]) 260 and FIFO output (O_DQ[0]) 260, as shown by waveform 386. Moreover, the process of reading may continue as long as the read enable (I_RE) 144 is enabled.

Figure 10A:
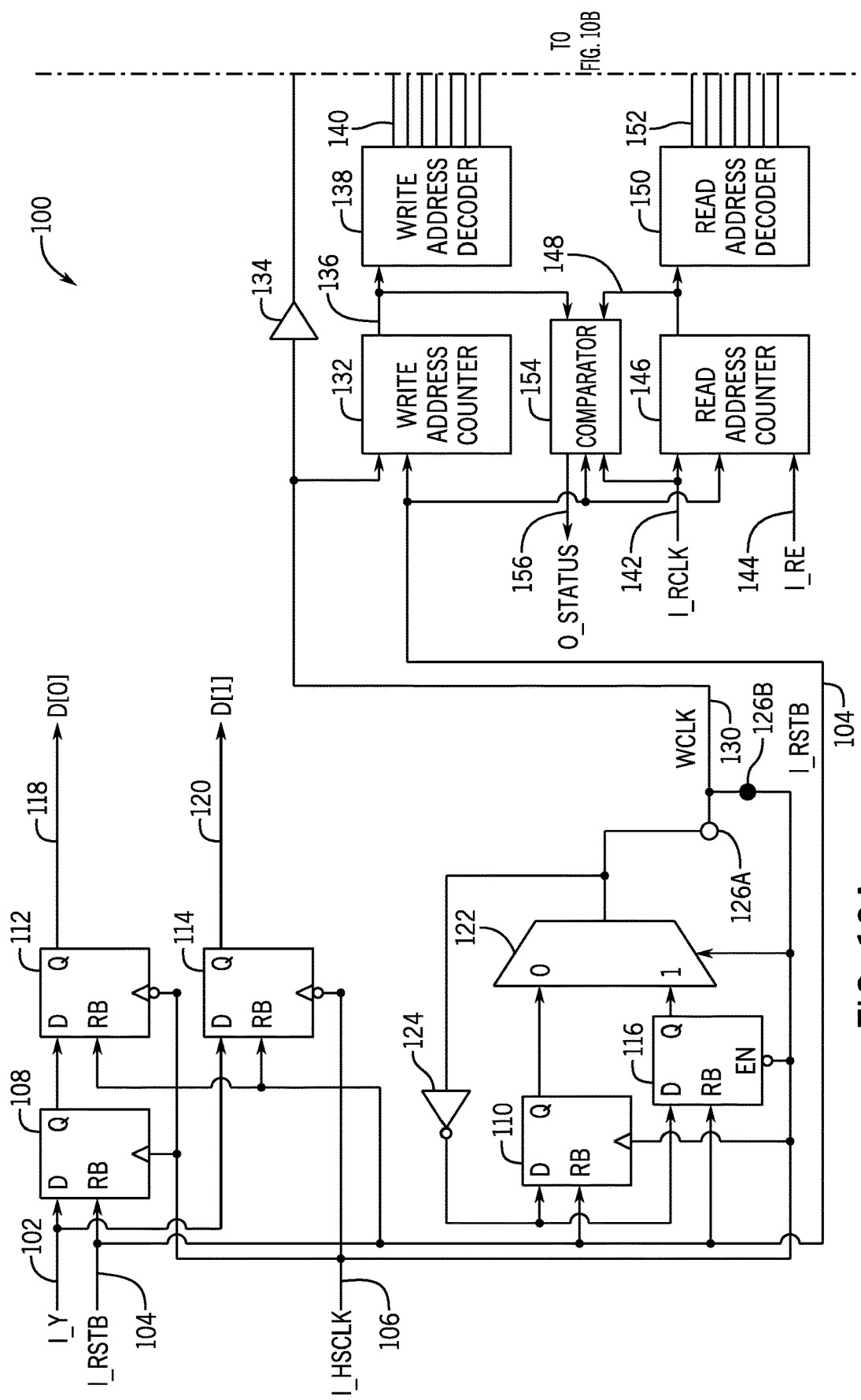
FIG. 10A is a schematic diagram of the data interface block of FIG. 6A configured for SDR sampling and a deserializer circuit, in accordance with an embodiment of the present disclosure.
Figure 10B:
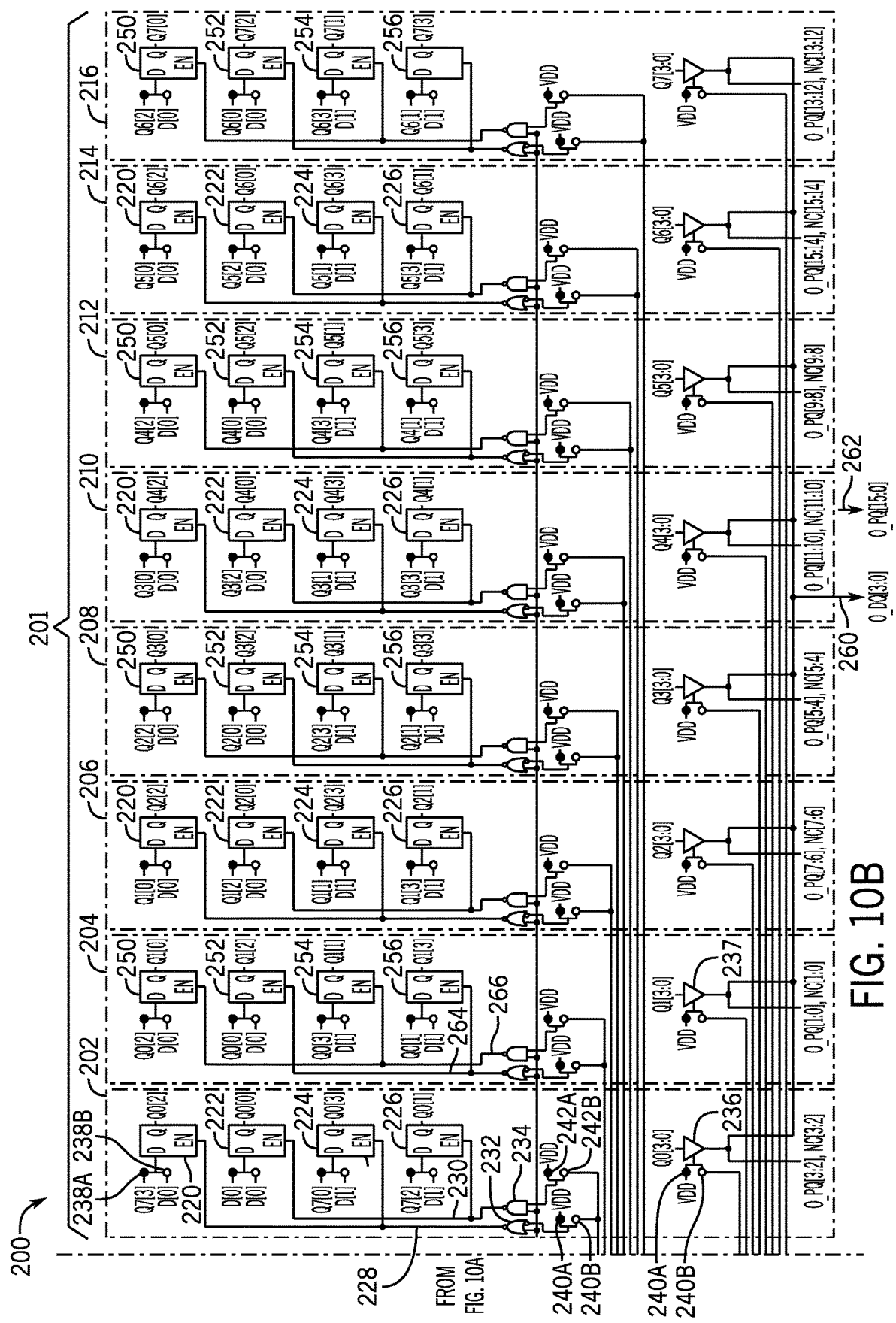
FIG. 10B is a schematic diagram of the data logic blocks of FIG. 6B configured for SDR sampling and the deserializer circuit, in accordance with an embodiment of the present disclosure.

FIG. 10A and FIG. 10B depict a static configuration for SDR sampling and a deserializer circuit using via sites 56 to selectively enable circuit components of the data interface block 100 of FIG. 6A and circuitry 200 of FIG. 6B. In the depicted embodiment, write clock (WCLK) 130 is the same frequency of input high speed clock (I_HSCLK) 106. As shown, particular via sites 56 are selected to connect or disconnect components between the two layers (e.g., vertical segment layer 52 and the horizontal segment layer 54 of FIGS. 3A and 3B) of the integrated circuit device to generate a complete circuitry for the particular deserializer application. Specific via sites 56 may be selected, as indicated by the dark shading, to interconnect the components between the two layers 52, 54.

In this deserializer circuit, the input of latches (e.g., 220, 222, 224, 226 of data storage block 202) in the data storage blocks 202, 204, 206, 208, 210, 212, 214, 216 may be connected to the output of latches of the previous stage, except for latch 222, which is connected to data bus line D[0] 118. In some embodiments, the latches may be chained in series. Moreover, the programmable input of the NAND gate 234 and NOR gate 232, and the programmable select of the tri-state buffer 236 and 237 may be connected to VDD.

Figure 11:
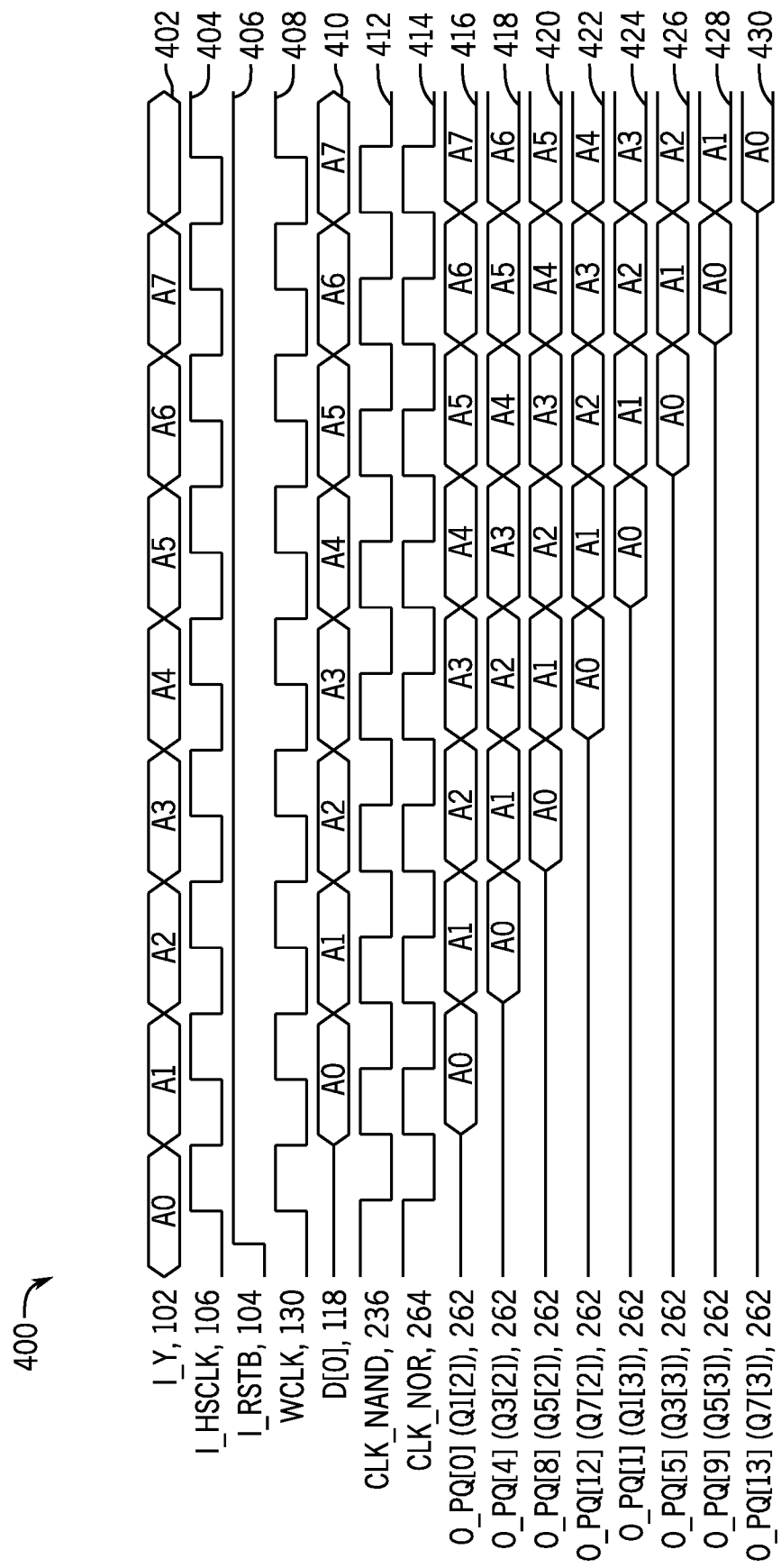
FIG. 11 is a block diagram of waveforms for SDR sampling and deserializer application using the configured circuitry of FIG. 10A and FIG. 10B, in accordance with an embodiment of the present disclosure.

FIG. 11 illustrates waveforms 400 demonstrating the relationships between signals for SDR sampling and deserializer application for the configured circuitry in FIG. 10A and FIG. 10B. As shown by waveform 408, input data (I_Y) 102 may be sampled at rising edge of input high speed clock (I_HSCLK) 106, and write clock (WCLK) 130 may be the same frequency of the input high speed clock (I_HSCLK) 106. Waveform 410 shows the data sequence of D[0] 118. Since one of the inputs of clock NAND (CLK_NAND) 230 is tied to VDD, the clock NAND (CLK_NAND) 230 may behave like an inversion of write clock (WCLK) 130, but with some delay due to buffer 134, as shown by waveform 412. The clock NAND (CLK_NAND) 230 of each of the data storage blocks 202, 204, 206, 208, 210, 212, 214, and 216 may toggle simultaneously. Similarly, since one of the inputs of clock NOR (CLK_NOR) 228 is tied to VDD, the clock NOR (CLK_NOR) 228 may behave like an inversion of write clock (WCLK) 130, but with some delay due to buffer 134, as shown by waveform 414. The clock NOR (CLK_NOR) 228 of each of the data storage blocks 202, 204, 206, 208, 210, 212, 214, and 216 may also toggle simultaneously. Since the select of the tri-state buffer 236 is connected to VDD, the tri-state buffer 236 may behave like a buffer. Similarly, the respective tri-state buffers of each of the data storage blocks 202, 204, 206, 208, 210, 212, 214, and 216 may each behave like a buffer.

At the first cycle of write clock (WCLK) 130, during the low phase of clock NAND (CLK_NAND) 230, latch 222 may be enabled and data A0 may be latched into Q0[0]. During the high phase of clock NOR (CLK_NOR) 264, latch 252 may be enabled and the Q0[0] may be latched into Q1[2]. As such, Q1[2] data may be propagated to the deserializer output (O_PQ[0]) 262 as the first bit of deserializer output, as shown by waveform 416.

Similarly, at the second cycle of the write clock (WCLK) 130, the data A0 may be latched into Q2[0] and Q3[2], which will be propagated to the deserializer output (O_PQ[4]) 262 as the second bit of deserializer output, as shown by waveform 418. At the same time, the new data A1 may be latched into Q1[2] and propagated to the deserializer output (O_PQ[0]) 262.

This deserializer circuit may support any dividing factor from 1 to 15. The sequence of the deserializer output may include O_PQ[0] (Q1[2]), O_PQ[4] (Q3[2]), O_PQ[8] (Q5[2]), O_PQ[12] (Q7[2]), O_PQ[1] (Q1[3]), O_PQ[5] (Q3[3]), O_PQ[9](Q5[3]), O_PQ[13] (Q7[3]), O_PQ[6] (Q2[2]), O_PQ[10] (Q4[2]), O_PQ[14] (Q6[2]), O_PQ[3] (Q0[3]), O_PQ[7] (Q2[3]), O_PQ[11] (Q4[3]), and O_PQ[15] (Q6[3]). The depicted embodiment illustrates a 1:8 deserializer. After eight pulses of the input high speed clock (I_HSCLK) 106, eight serial data A0-A7 may be converted to eight parallel output.

Figure 12A:
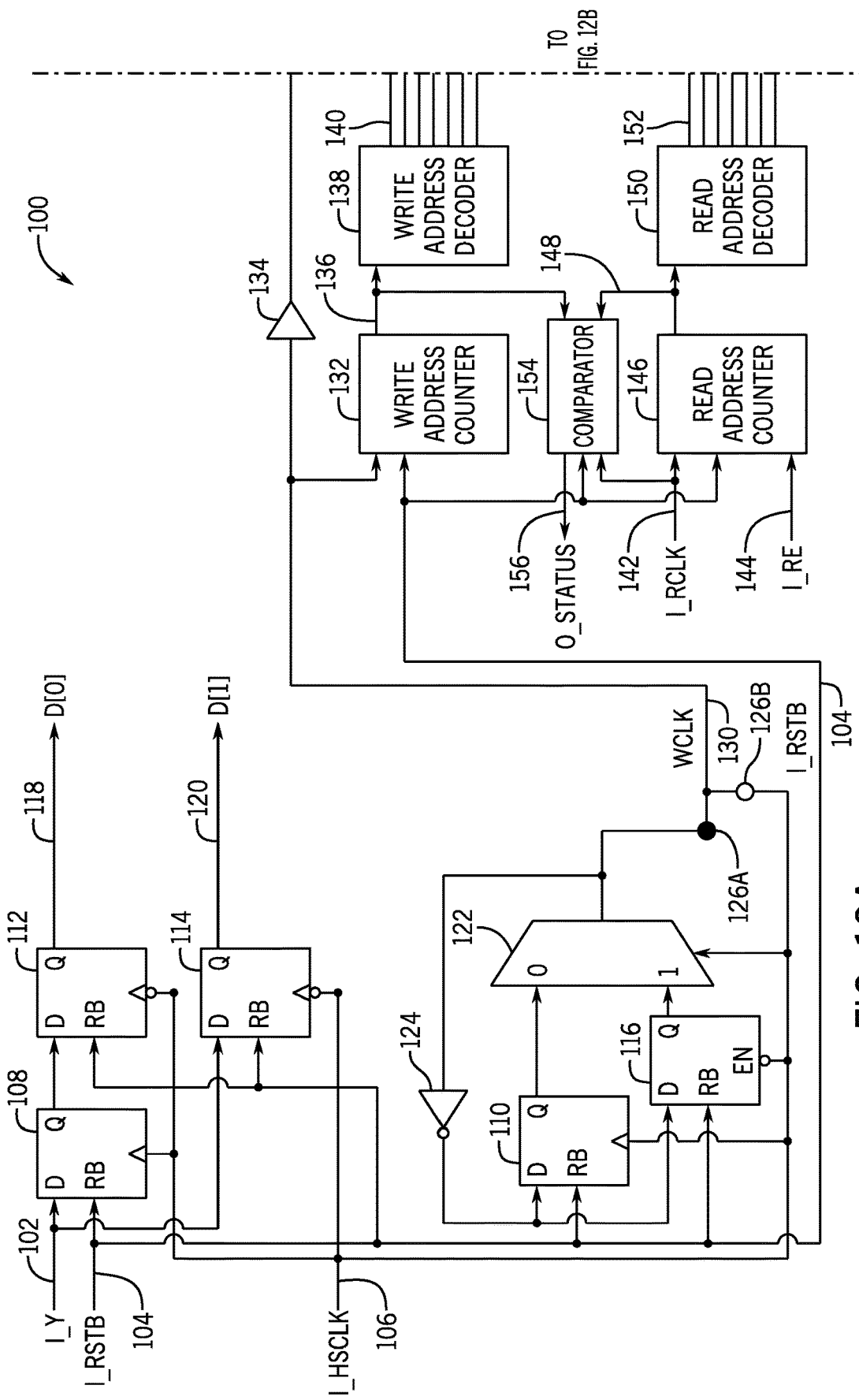
FIG. 12A is a schematic diagram of the data interface block of FIG. 6A configured for DDR sampling and a deserializer circuit, in accordance with an embodiment of the present disclosure.
Figure 12B:
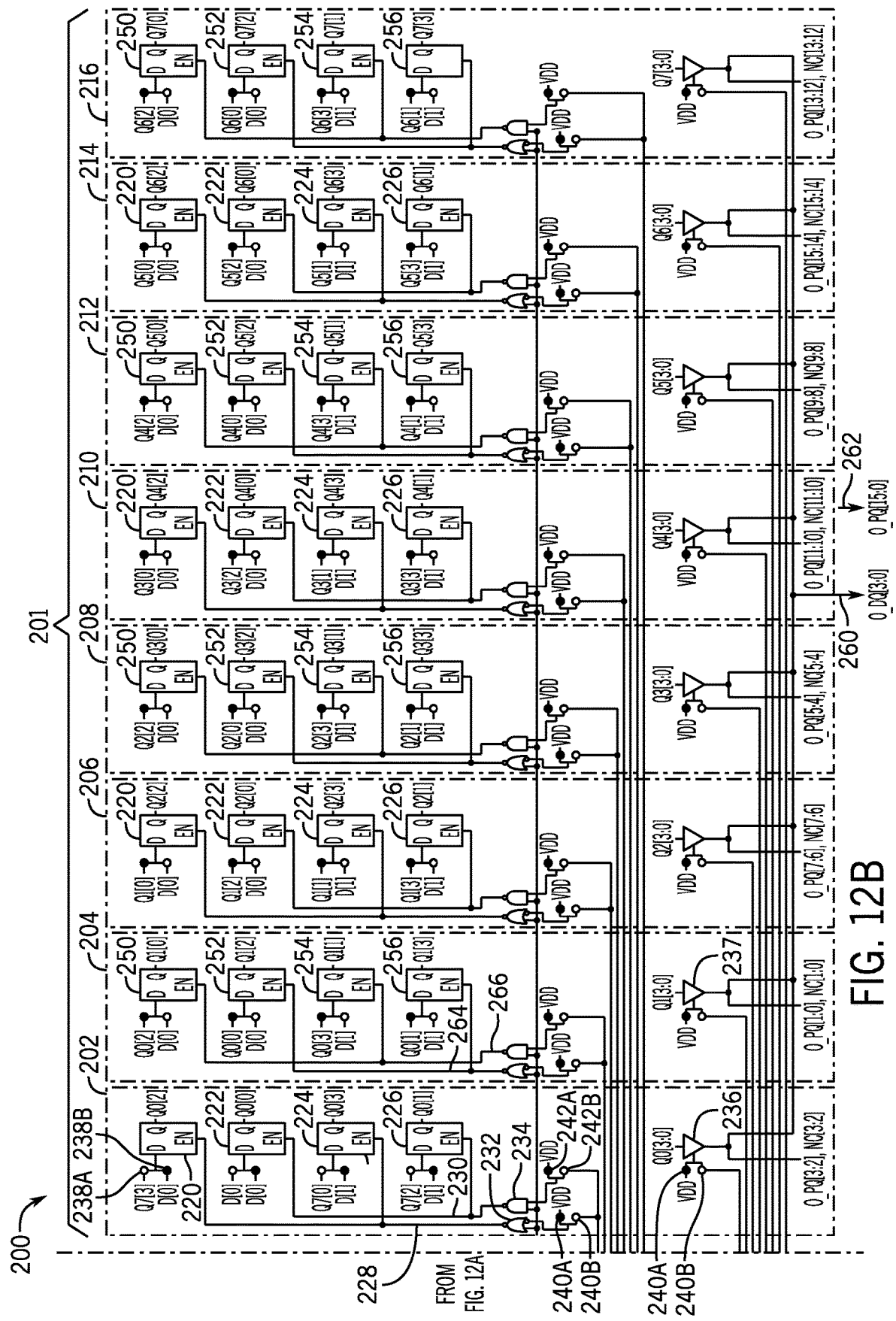
FIG. 12B is a schematic diagram of the data logic blocks of FIG. 6B configured for DDR sampling and the deserializer circuit, in accordance with an embodiment of the present disclosure.

FIG. 12A and FIG. 12B illustrate a static configuration for DDR sampling and a deserializer circuit, using via sites 56 to selectively connect circuit components of the data interface block 100 of FIG. 6A and circuitry 200 of FIG. 6B. FIG. 12A is similar to FIG. 10A except for the write clock (WCLK) 130. In particular, write clock (WCLK) 130 in FIG. 10A is half the frequency of the input high speed clock (I_HSCLK) 106 in FIG. 12A. FIG. 12B is similar to FIG. 10B except for the input data assignment of latches in data storage block 202 (e.g., latches 220, 222, 224, and 226).

Figure 13:
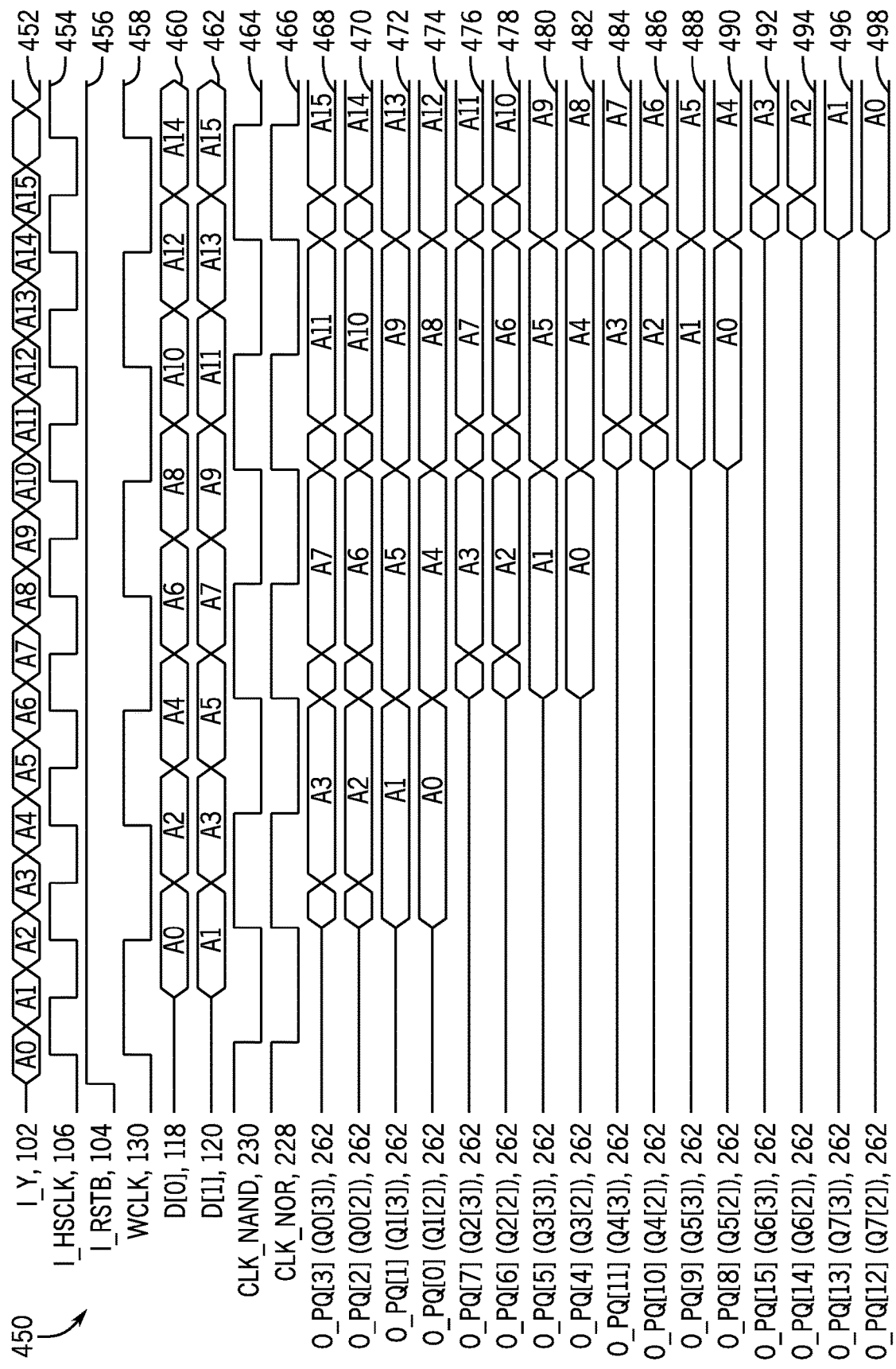
FIG. 13 is a block diagram of waveforms for DDR sampling and the deserializer application using the configured circuitry of FIG. 12A and FIG. 12B, in accordance with an embodiment of the present disclosure.

FIG. 13 illustrates waveforms indicating the relationships between signals for DDR sampling and deserializer application for the configured circuitry of FIG. 12A and FIG. 12B. As shown waveform 458, input data (I_Y) 102 may be sampled at both the rising and falling edge of input high speed clock (I_HSCLK) 106, and write clock (WCLK) 130 may be half the frequency of the input high speed clock (I_HSCLK) 106. Waveform 460 indicates the data sequence of data bus line D[0] 118 and waveform 462 indicates the data sequence of data bus line D[1] 120. Since one of the inputs of clock NAND (CLK_NAND) 230 is connected to VDD, the clock NAND (CLK_NAND) 230 may behave like an inversion of write clock (WCLK) 130, but with some delay due to buffer 134, as shown by waveform 464. The clock NAND (CLK_NAND) 230 of each of the data storage blocks 202, 204, 206, 208, 210, 212, 214, and 216 may toggle simultaneously.

Similarly, since one of the inputs of clock NOR (CLK_NOR) 228 is connected to VDD, the clock NOR (CLK_NOR) 228 may behave like an inversion of write clock (WCLK) 130, but with some delay due to buffer 134, as shown in waveform 466. The clock NOR (CLK_NOR) 228 of each of the data storage blocks 202, 204, 206, 208, 210, 212, 214, and 216 may also toggle simultaneously. Since the select of the tri-state buffer 236 is connected to VDD, the tri-state buffer 236 may behave like a buffer. Similarly, the respective tri-state buffers of each of the data storage blocks 202, 204, 206, 208, 210, 212, 214, and 216 may behave like a buffer.

At the first cycle of write clock (WCLK) 130, during the low phase of clock NAND (CLK_NAND) 230, latch 222 and latch 226 may be enabled and data A0 and A1 may be latched to Q0[0] and Q0[1] respectively. During the high phase of clock NOR (CLK_NOR) 264, latch 252 and latch 256 may be enabled and the data Q0[0] and Q0[1] may be latched into Q1[2] and Q1[3] respectively. As such, Q1[2] data and Q1[3] data may be propagated to the deserializer outputs (O_PQ[0] and O_PQ[1]) 262 as the first bit and second bit of deserializer output as shown in waveform 474 and 472.

At the same time (e.g., high phase of the clock NOR (CLK_NOR) 659) latch 220 and latch 224 may be enabled, and data A2 may be latched into Q0[2] and A3 may be latched into Q0[3]. As shown by waveform 476, Q0[2] data may be propagated to the deserializer output (O_PQ[2]) 262 as a third bit of the deserializer output. Similarly, Q0[3] data may be propagated to the deserializer output (O_PQ[3]) 262 as a fourth bit of deserializer output.

This deserializer circuit may support a dividing factor of 4, 8, 12, and 16. The depicted embodiment illustrates a 1:12 deserializer, and after 6 pulses of the input high speed clock (I_HSCLK) 106, twelve serial data A0-A11 may be converted to 12 parallel outputs. As such, different application circuits (e.g., FIFO or deserializer) may be implemented using the same single configurable circuit architecture (e.g., data interface block with data logic blocks of a configurable FIFO and deserializer circuit) with a via layer 50. Specifically, the particular application circuit may be implemented by selecting specific via sites 56 of the via layer 50.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device comprising:
   a data interface block;
   a plurality of data logic blocks connected to the data interface block at least in part by vias of a via layer, wherein the vias are arranged on the via layer in a via configuration; and
   the via layer, wherein the via layer causes the data interface block and the plurality of data logic blocks to operate at least in part as a deserializer circuit when the via configuration of the via layer is a first via configuration and a first-in-first-out (FIFO) circuit when the via configuration of the via layer is a second via configuration.

2. The integrated circuit device of claim 1, wherein the first via configuration comprises a first configuration of via sites in the via layer and the second via configuration comprises a second configuration of via sites in the via layer, wherein the first configuration of via sites and the second configuration of via sites are different.

3. The integrated circuit device of claim 1, wherein the via layer, based on the configuration of the via layer, causes the integrated circuit device to perform double data rate (DDR) sampling in a third via configuration or a single data rate (SDR) sampling in a fourth via configuration.

4. The integrated circuit device of claim 1, wherein the first via configuration and the second via configuration are static.

5. The integrated circuit device of claim 1, wherein the integrated circuit device comprises a multiplexer circuit, wherein the multiplexer circuit allows a dynamic configuration of the first via configuration or the second via configuration.

6. The integrated circuit device of claim 1, wherein the via layer comprises a plurality of vertical segments, a plurality of horizontal segments, or a combination thereof.

7. The integrated circuit device of claim 6, wherein the plurality of vertical segments, the plurality of horizontal segments, or a combination thereof, are connected using one or more jumpers.

8. The integrated circuit device of claim 7, wherein the one or more jumpers allow reconfiguring connections of the via layer, and wherein the reconfiguring results in connecting or disconnecting the plurality of data logic blocks to the data interface block based on the reconfiguration of the via layer.

9. The integrated circuit device of claim 1, wherein the via layer is associated with a single via mask.

10. A method of manufacturing an integrated circuit comprising:
    forming circuitry using a first one or more masks; and
    forming vias using a second one or more masks to produce one of a plurality of via configurations, wherein a first via configuration of the plurality of via configurations causes a first portion of the circuitry to operate as a deserializer circuit, and wherein a second via configuration of the plurality of via configurations causes a second portion of the circuitry to operate as a first-in-first-out (FIFO) circuit.

11. The method of claim 10, wherein circuitry of the first via configuration and the second via configuration comprise at least one redundant component, wherein the redundant component is a common component to the integrated circuit resulting from the first via configuration and the integrated circuit resulting from the second via configuration.

12. The method of claim 10, wherein at least one via site of a via layer used in the first via configuration is unused in the second via configuration.

13. The method of claim 10, wherein the vias comprise via sites, wherein the via sites are positioned based on applications to be implemented using a single layer of the vias and its connection to the circuitry.

14. A configurable circuit, comprising:
    a circuit comprising one or more data logic blocks comprising one or more flip-flops, one or more multiplexers, one or more inverters, one or more comparators, one or more read address counters, one or more read address decoders, one or more write address counters, one or more write address decoders, or a combination thereof; and a plurality of vias connected to at least a portion of the circuit to implement a first-in-first-out circuit in a first via configuration or a deserializer circuit in a second via configuration.

15. The configurable circuit of claim 14, wherein the plurality of vias enabled to implement the first-in-first-out circuit in the first via configuration comprise at least one different enabled via of the plurality of vias to implement the deserializer circuit in the second via configuration.

16. The configurable circuit of claim 14, the circuit comprising a data interface block, wherein the data interface block is configured for a double data rate (DDR) or a single data rate (SDR) sampling.

17. The configurable circuit of claim 14, wherein each of the plurality of data logic blocks comprise two active high latches and two active low latches, a NOR gate with an inverted input, a NAND gate, a tri-state buffer, or a combination thereof.

18. The configurable circuit of claim 17, wherein the two active high latches, the two active low latches, the NOR gate with an inverted input, the NAND gate, and the tri-state buffer are connected to at least one via of the plurality of vias, wherein at least one via comprises an input connection.

19. The configurable circuit of claim 17, wherein the plurality of data logic blocks are each connected to a different one bit of a read word line from the one or more read address decoders and a different one bit of a write word line from the one or more write address decoders.

20. The configurable circuit of claim 17, wherein the one or more flip-flops are activated and data is latched into a respective flip-flop of the one or more flip-flops based on an input high speed clock signal, wherein implementing the first-in-first-out circuit comprises a write clock signal that is half a frequency of the input high speed clock signal, wherein the write clock signal is selected using one of the plurality of vias.

* * * * *